United States Patent
Okada (10) Patent No.: US 10,598,569 B2
(45) Date of Patent: Mar. 24, 2020

(54) METHOD FOR PREDICTING ROLLING RESISTANCE OF TIRE AND DEVICE FOR PREDICTING ROLLING RESISTANCE OF TIRE

(71) Applicant: KOBE STEEL, LTD., Hyogo (JP)

(72) Inventor: Toru Okada, Hyogo (JP)

(73) Assignee: Kobe Steel, Ltd., Hyogo (JP)

( * ) Notice: Subject to any disclaimer, the term of this patent is extended or adjusted under 35 U.S.C. 154(b) by 591 days.

(21) Appl. No.: 15/309,999

(22) PCT Filed: May 7, 2015

(86) PCT No.: PCT/JP2015/063224
§ 371 (c)(1),
(2) Date: Nov. 9, 2016

(87) PCT Pub. No.: WO2015/174323
PCT Pub. Date: Nov. 19, 2015

(65) Prior Publication Data
US 2017/0153163 A1    Jun. 1, 2017

(30) Foreign Application Priority Data

May 12, 2014 (JP) .................. 2014-098691
Feb. 16, 2015 (JP) .................. 2015-027672

(51) Int. Cl.
*G01M 17/02*     (2006.01)
*G06F 30/20*     (2020.01)
*G05B 15/02*     (2006.01)

(52) U.S. Cl.
CPC ........ *G01M 17/022* (2013.01); *G01M 17/021* (2013.01); *G05B 15/02* (2013.01); *G06F 30/20* (2020.01)

(58) Field of Classification Search
CPC .. G01M 17/022; G01M 17/021; G05B 15/02; G06F 17/5009
(Continued)

(56) References Cited

U.S. PATENT DOCUMENTS

| | | | |
|---|---|---|---|
| 6,606,569 B1 * | 8/2003 | Potts ........................ | G01L 5/00 702/41 |
| 7,340,947 B2 * | 3/2008 | Shinomoto ........... | G01M 1/045 73/146 |

(Continued)

FOREIGN PATENT DOCUMENTS

| | | |
|---|---|---|
| JP | H11-237332 A | 8/1999 |
| JP | 2003-004598 A | 1/2003 |

(Continued)

OTHER PUBLICATIONS

International Search Report; PCT/JP2015/063224 dated Jul. 28, 2015; with English language translation.
(Continued)

*Primary Examiner* — Juan C Ochoa
(74) *Attorney, Agent, or Firm* — Studebaker & Brackett PC (57) ABSTRACT

An applied load acting on a tire is varied by alternately moving a load drum in a direction of approaching and leaving the tire. A phase difference between a variation of a position of the load drum and a variation of the applied load is calculated. A tire having an abnormality in rolling resistance is sorted out based on the calculated phase difference.

11 Claims, 7 Drawing Sheets

(58) Field of Classification Search
USPC .......................................................... 703/2
See application file for complete search history.

(56) References Cited

U.S. PATENT DOCUMENTS

| | | | | |
|---|---|---|---|---|
| 7,434,454 | B2 * | 10/2008 | Matsumoto | G01M 17/022 451/1 |
| 8,082,779 | B2 * | 12/2011 | Okada | G01M 17/022 73/146 |
| 9,080,921 | B2 * | 7/2015 | Okada | G01M 17/022 |
| 9,360,396 | B2 * | 6/2016 | Okada | G01M 17/022 |
| 9,645,024 | B2 * | 5/2017 | Okada | G01L 5/16 |
| 10,222,300 | B2 * | 3/2019 | Okada | G01M 17/024 |
| 2011/0113875 | A1 | 5/2011 | Okada et al. | |
| 2013/0262014 | A1 | 10/2013 | Okada et al. | |

FOREIGN PATENT DOCUMENTS

| | | |
|---|---|---|
| JP | 2005-306113 A | 11/2005 |
| JP | 2009-222656 A | 10/2009 |
| JP | 2011-173555 A | 9/2011 |
| JP | 2011-226991 A | 11/2011 |
| KR | 2011-0036135 A | 4/2011 |
| WO | 2012/086547 A1 | 6/2012 |

OTHER PUBLICATIONS

Written Opinion of the International Searching Authority; PCT/JP2015/063224 dated Jul. 28, 2015; with English language translation.

* cited by examiner

EXCITATION FREQUENCY : 5Hz
(EXCITATION PERIOD : 0.2s)

FIG. 5B

EXCITATION FREQUENCY : 5.5Hz
(EXCITATION PERIOD : 0.18182s)

FIG. 5C

EXCITATION FREQUENCY : 5.333Hz
(EXCITATION PERIOD : 0.1875s)

FIG. 6

METHOD FOR PREDICTING ROLLING RESISTANCE OF TIRE AND DEVICE FOR PREDICTING ROLLING RESISTANCE OF TIRE

This application is based on Japanese Patent Application No. 2014-098691 filed May 12, 2014, and Japanese Patent Application No. 2015-027672 filed Feb. 16, 2015, the content of which is incorporated herein by reference.

TECHNICAL FIELD

The present invention relates to a tire rolling resistance prediction method and a tire rolling resistance prediction device which can sort out a tire having an abnormality in rolling resistance among tires to be tested when a plurality of product tires are tested.

BACKGROUND ART

In the related art, when property and performance of a tire for truck, passenger vehicle, and another vehicle are measured, a rolling resistance of the tire is considered as one of important measurement items. The rolling resistance of the tire is a force in a tangential direction generated between the tire and the ground when the tire is rolled on the ground. A tire testing machine measures the rolling resistance of the tire as the force in the tangential direction generated between the test tire and a partner surface rotating in contact with the tire (for example, a surface of a load drum). That is, when a force (applied load Fz), which has a predetermined magnitude in a radial direction between the tire and the partner surface, is applied, a rolling resistance Fx is generated in response to the applied load Fz of the tire, and a relation between the applied load Fz and the rolling resistance Fx is measured.

Such a "rolling resistance measurement method" is a method performed by a drum-type tire traveling test machine, and is defined in Japanese Industrial Standard JIS D 4234 (passenger car, truck and bus tires—methods of measuring rolling resistance, 2009). JIS D 4234 defines four measuring methods of a "force method" of measuring the rolling resistance Fx with a tire spindle or obtaining a counterforce through a conversion, a "torque method" of measuring an input value of a torque when a rotation is applied to the tire by the load drum, a "coasting method" of obtaining a deceleration of assembly of the load drum and the tire, and a "power method" of obtaining a power input when a rotation is applied to the tire by the load drum. Even in a case where the rolling resistance of the tire is measured by any one of those methods, it is necessary to apply the large applied load Fz to the tire. Therefore, in order to measure the rolling resistance Fx smaller than the applied load Fz, a dedicated testing machine having a proper accuracy is necessary. For example, in the case of a passenger car, in a case where the applied load Fz is about 500 kgf, a magnitude of the rolling resistance Fx is a little less than about 10 kgf, and a dedicated testing device which can measure such a small rolling resistance Fx is already commercialized.

As such a rolling resistance testing machine, for example, a machine illustrated in Patent Reference 1 is known. The rolling resistance measuring device in Patent Reference 1, the tire is brought into compressive contact with an outer circumferential surface of a cylindrical load drum (traveling drum). The tire bears a spindle through a bearing, and the force applied in x, y, and z-axial directions and a torque (moment) are measured by a multiple component force detector of the spindle. In the device in Patent Reference 1, a correction is performed with respect to interference between those component forces, and then, a relation between the applied load Fz in an axial direction of the tire and the rolling resistance Fx is measured.

Patent Reference 2 discloses a method of predicting the rolling resistance of the tire based on a measurement result of the viscoelastic characteristics of various kinds of rubber members forming the tire and a numerical analysis based on FEM (Finite Element Method) model of the tire. The rolling resistance of the tire is calculated from the entire energy loss calculated from a product-sum operation of the deformation amounts of the various kinds of rubber members and the attenuation characteristics of the rubber members at the time of rotating the tire.

CITATION LIST

Patent Reference

Patent Reference 1: JP-A-2003-4598
Patent Reference 2: JP-A-2011-226991

SUMMARY OF THE INVENTION

Problems that the Invention is to Solve

When a method of measuring the rolling resistance of the tire defined in the above-described JIS D 4234 is performed using a technology of Patent Reference 1, the following problems occur. For example, a measuring method of JIS D 4234 defines that in order to stabilize the temperature of the tire, a running-in operation is performed for thirty minutes or more prior to the measurement. However, it is difficult to implement the operation over such a long time with respect to all the manufactured tires which are produced in quantity. For this reason, in an actual manufacturing site, the total inspection is not performed, but it is checked whether partial sampled tires satisfy the necessary performance of the rolling resistance.

However, since such a sampling test has a possibility that a tire having an abnormality in rolling resistance is missed to be leaked to a market, the total inspection is desirably performed also on the rolling resistance test similarly to the tire uniformity test (Japanese Industrial Standard JIS D 4233) inspecting the uniformity of the tire. For example, in TUM (Tire Uniformity Machine) testing machine which is a dedicated machine of the tire uniformity test, one tire is measured and evaluated about in thirty seconds, and thus the total inspection can be performed on the manufactured tire which is produced in quantity. For this reason, in the TUM testing machine provided in numbers in a factory, it is considered that the rolling resistance is measured entirely.

In the TUM testing machine, the load drum is pushed to the tire of the rim-assembled spindle shaft by a predetermined load, and the interaxial distance between the spindle shaft and the load drum is fixed. Then, the tire is rotated at about 60 rpm, and the variation force (Force Variation) generated in the tire is measured. Specifically, the TUM testing machine measures the load variation RFV (Radial Force Variation) of the tire load in an applying direction, and the load variation LFV (Lateral Force Variation) of the tire in a width direction. The load measuring device (load cell) used to measure the load variation RFV or the load variation LFV is mounted on the load drum side such that the load drum can rotate freely. The spindle shaft provided with the tire is often driven to measure the load variation RFV or the load variation LFV with the load measuring device provided on the load drum side.

In a case where the above-described four measuring methods of JIS D 4234 are performed using such a TUM testing machine, the general TUM testing machine is not provided with a sensor for measuring a load in a direction of the rolling resistance Fx of the tire or a driving torque of the tire or the drum, and thus it is not possible to measure the rolling resistance Fx. In the TUM testing machine, a rotational resistance of a tire shaft itself or a drum shaft itself is larger than a dedicated machine for measuring the rolling resistance. Such a large rotational resistance becomes a large error factor in a case where the TUM testing machine measures the rolling resistance Fx of the tire, and thus it is necessary to improve a structure so as to extremely reduce the rotational resistance, which drives the cost of the tire testing machine up sharply.

In the case of a "power method" of measuring a motor power rotating the tire or the load drum, and a "coasting method" of measuring deceleration times of the rotating tire and load drum, it is possible to measure the rolling resistance without the addition of the above-described sensor. However, since there is an effect of the rotational resistance of the rotating shaft of the tire or the load drum, and the test should be performed at a low speed rotation of 60 rpm, it is hard to accurately measure the rolling resistance and to cope with the total inspection.

Of course, Patent Reference 2 does not propose a solution to such a problem.

The present invention is made in consideration of the above-described problem, and an object of the present invention is to provide a tire rolling resistance prediction method and a tire rolling resistance prediction device for sorting out a tire having an abnormality in the rolling resistance in a short time.

Means for Solving the Problems

To achieve the above-described object, a tire rolling resistance prediction method of the present invention takes the following technical means. That is, according to the present invention, there is provided a tire rolling resistance prediction method for sorting out a tire having an abnormality in rolling resistance by using a rolling resistance prediction device, the rolling resistance prediction device including: a load measurement sensor configured to measure an applied load applied to the tire when a load drum simulating a travel road surface is brought into compressive contact with a tread surface of the tire; and a displacement sensor configured to measure a position of the load drum in a load direction, the tire rolling resistance prediction method including: varying the applied load acting on the tire by alternately moving the load drum in a direction of approaching and leaving the tire; calculating a phase difference between a variation of the position of the load drum and a variation of the applied load; and sorting out the tire having an abnormality in rolling resistance based on the calculated phase difference.

Preferably, a tire having the phase difference exceeding a predetermined threshold value may be determined as the tire having an abnormality in rolling resistance.

Preferably, when the phase difference is set to δ, a tire having tan δ exceeding the predetermined threshold value may be determined as the tire having an abnormality in rolling resistance.

Preferably, the phase difference between the variation of the position of the load drum and the applied load in which inertial force of the load drum is removed may be calculated, and the inertial force of the load drum may be calculated from a product of acceleration of the load drum in the approaching and leaving direction and weight of the load drum.

Preferably, a tire uniformity testing machine for evaluating uniformity in a circumferential direction of the tire may be used as the rolling resistance prediction device.

Preferably, when the load drum is alternately moved in the approaching and leaving direction, air may be sealed in the tire.

Preferably, the applied load acting on the tire may be varied in a state where the load drum and the tire are rotated.

Preferably, when the applied load applied to the tire is measured while varying the applied load acting on the tire, in a case where an excitation period of the load drum in the approaching and leaving direction is set to Td, and a rotation period of the tire is set to Tt, a measurement time for measuring the applied load may be set to N×Tt (N is an integer of 2 or more), and Td is set such that Tt/Td is not an integer, and N×Tt/Td is an integral value.

Preferably, a tire having a well-known rolling resistance may be set as a standard tire, the position of the load drum with respect to the standard tire and the applied load may be obtained under each of a plurality of temperature conditions, the obtained positions of the load drum and the applied loads under the plurality of temperature conditions may be used to make a temperature correction function with respect to the phase difference, and the made temperature correction function may be used to sort out the tire having an abnormality in rolling resistance.

A tire rolling resistance prediction device according to the present invention includes a tire sorting unit configured to perform the above-described method.

A tire rolling resistance prediction device includes: a load measurement sensor configured to measure an applied load applied to the tire when a load drum simulating a travel road surface is brought into compressive contact with a tread surface of a tire; a displacement sensor configured to measure a position of the load drum in a load direction; a drum moving unit configured to vary the applied load acting on the tire by alternately moving the load drum in a direction of approaching and leaving the tire; and a tire sorting unit configured to calculate a phase difference between a variation of the position of the load drum and a variation of the applied load, and configured to sort out a tire having an abnormality in rolling resistance based on the calculated phase difference.

Advantages of the Invention

According to the present invention, it is possible to sort out a tire having an abnormality in rolling resistance in a short time.

MODES FOR CARRYING OUT THE INVENTION

Figure 1:
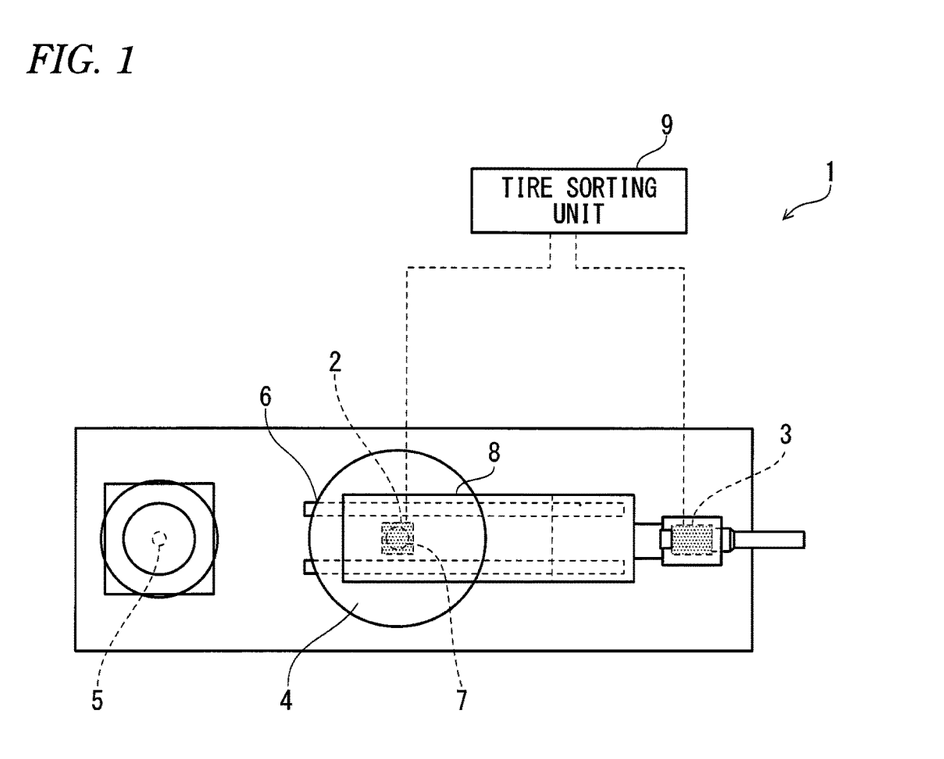
FIG. 1 is a plan view illustrating a tire rolling resistance prediction device.
Figure 2:
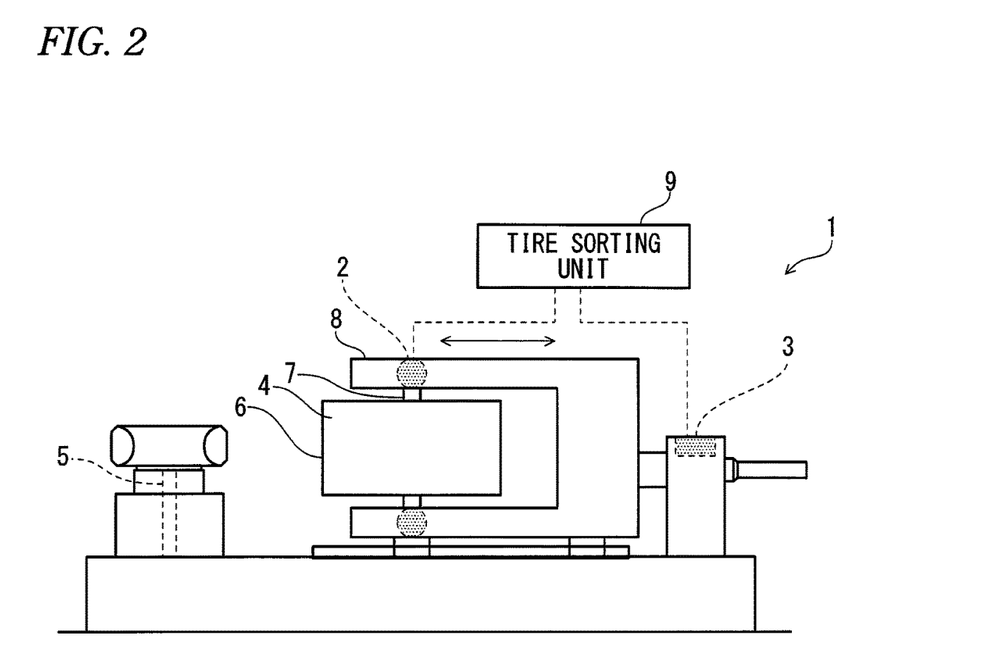
FIG. 2 is a front view illustrating the tire rolling resistance prediction device.

Hereinafter, an embodiment of a tire rolling resistance prediction method of the present invention and a rolling resistance prediction device 1 implementing the rolling resistance prediction method will be described in detail based on the drawings. FIGS. 1 and 2 schematically illustrate a rolling resistance prediction device 1 implementing a tire sorting method of this embodiment. The rolling resistance prediction device 1 is a tire uniformity testing machine which evaluates the uniformity of the tire in a radial direction as a product inspection by measuring the tire uniformity of a product tire, that is, RFV and the like indicating the variation of force in a radial direction of the tire. However, when the rolling resistance prediction device 1 of the present invention includes a load measurement sensor 2 and a displacement sensor 3 (to be described later), the rolling resistance prediction device 1 can be used as another tire testing machine in addition to the tire uniformity testing machine.

As illustrated in FIGS. 1 and 2, the rolling resistance prediction device 1 (uniformity testing machine) of this embodiment includes a cylindrical load drum 4 disposed such that an axial center thereof (rotating shaft 7) is directed vertically (in a paper depth direction of FIG. 1 and in a vertical direction of FIG. 2) and a tire shaft 5 mounted such that an axial center thereof is directed vertically. The axial center of the load drum 4 and the axial center of the tire shaft 5 are in parallel with each other. In the rolling resistance prediction device 1, the outer circumferential surface of the load drum 4 simulating the travel road surface is brought into compressive contact with a tread surface of a tire mounted on the tire shaft 5. The rolling resistance prediction device 1 includes the load measurement sensor 2 measuring an applied load applied to the tire and the displacement sensor 3 measuring a position of the load drum 4 in a load direction.

The load drum 4 is a cylindrical member of which the axial center is directed vertically, and the outer circumferential surface of the load drum 4 is a simulation road surface 6 for testing a tire. Specifically, the load drum 4 is formed to be in a cylindrical shape which has a short length and a large diameter such that a vertical dimension is shorter than a radial dimension. The rotating shaft 7 rotatably supporting the load drum 4 to be rotated vertically is disposed in the center of the load drum 4. The upper end and the lower end of the rotating shaft 7 are supported by a frame member 8. The frame member 8 is provided to expand horizontally (right and left direction in FIGS. 1 and 2), and is configured to support the above-described rotating shaft 7 to be bridged perpendicularly.

The load measurement sensor 2, which can measure the load generated from the rotating shaft 7 when the load drum 4 is pushed into the tread surface of the tire mounted on the tire shaft 5, is provided between the rotating shaft 7 and the frame member 8. Specifically, the frame member 8 (support frame) has a structure that supports the rotating shaft 7 through the load measurement sensor 2. Therefore, when the load drum 4 is brought into compressive contact with the tread surface of the tire, a load is transmitted to the load measurement sensor 2 of the rotating shaft 7, and the applied load applied to the tire is measured by the load measurement sensor 2.

A drum moving unit (not illustrated), which can move the load drum 4 horizontally with respect to a base, is disposed on the lower side of the above-described frame member 8. The drum moving unit moves the load drum 4 horizontally so that the load drum 4 can approach and separate from the tire shaft 5 fixed to the base. The displacement sensor, which measures the position (pushing position) of the load drum 4 with respect to the tire, is provided in the drum moving unit.

When a test of the tire uniformity is performed in the rolling resistance prediction device 1 having the above-described configuration, the load drum 4 is caused to approach the tire of the tire shaft 5 rotating at a predetermined rotational speed. When an average load measured by the load measurement sensor 2 is a predetermined load, the load drum 4 is stopped, and a load applied to the tire in a pushing direction is measured over one rotation of the tire using the load measurement sensor 2. The measurement of the load is performed in each of a state where the tire is normally rotated and a state where the tire is reversely rotated. In this manner, it can be measured to what extent the force applied to the tire is varied while the tire is rotated one time, thereby evaluating the tire uniformity.

The above-described measurement of the tire uniformity can be performed per tire during thirty seconds, and thus the entire tire manufactured by a manufacturing line can be subject to a total inspection. Herein, when "the rolling resistance of the tire" which is one of measurement items measuring the property and the performance of the tire can be measured even by the configuration of the above-described tire uniformity machine, a lot of information on the tire can be obtained. However, the tire uniformity machine usually cannot measure the "rolling resistance of the tire", and even in the case of a rolling resistance testing machine measuring the rolling resistance of the tire, it takes a long time when the measurement is performed according to the order of JIS standard (Japanese Industrial Standard). Therefore, it becomes difficult to cope with the total inspection.

In the rolling resistance prediction device 1 of this embodiment, another characteristic value which correlates with "the rolling resistance of the tire" is used to predict the rolling resistance, and even the tire uniformity machine can sort out the tire having an abnormality in "the rolling resistance of the tire". As the another characteristic value which correlates with the rolling resistance of the tire, a parameter of "tan δ indicating the attenuation characteristic of the tire rubber" is used in the rolling resistance prediction device 1 of this embodiment. For example, as a factor of the rolling resistance of the tire, the energy loss (hysteresis loss), which is caused by repeatedly distorting the tire rubber deformed by the load through rotations, affects the resistance largely. The hysteresis loss can be evaluated based on tan δ. "δ" of the tan δ corresponds to a phase difference between the distortion and the stress which are generated when an external force acts on the tire rubber periodically. As a value of tan δ is larger, the energy loss due to the deflection of the tire is larger, which results in the larger rolling resistance.

Specifically, "δ (phase difference) of tan δ" is measured by moving (excitation) the above-described load drum 4 alternately in a front and rear direction. That is, when the load drum 4 is moved alternately in the front and rear direction, the variation of the applied load, which is advanced more slightly than the variation of the position of the load drum 4 and acts on the tire, is observed. For this reason, when the variation of the position of the load drum 4 and the variation of the applied load are compared to calculate the phase difference therebetween, tan of the phase difference corresponds to the above-described "tan δ". In the rolling resistance prediction device 1 of this embodiment, by determining whether the value of tan δ calculated in this manner exceeds the predetermined threshold value, the tire having an abnormality in "rolling resistance" is sorted out. Such a tire sorting method is performed using a tire sorting unit 9 provided practically in the rolling resistance prediction device 1.

Next, description will be given about the tire sorting unit 9 provided in the rolling resistance prediction device 1 of this embodiment and the tire sorting method performed by the tire sorting unit 9. As illustrated in FIGS. 1 and 2, the tire sorting unit 9 includes a computer such as a personal computer provided in the rolling resistance prediction device 1 separately from the load drum 4 and the tire shaft 5. The applied load measured by the load measurement sensor 2 and the position of the load drum 4 measured by the displacement sensor 3 are input as a signal to the tire sorting unit 9. In the tire sorting unit 9, the input signals of the position of the load drum 4 and the applied load are processed in a below-described procedure so as to sort out the tire.

Next, the description will be given about a procedure of the signal process performed by the tire sorting unit 9, in other words, the tire sorting method of the present invention. When the above-described tire sorting unit 9 sorts out the tire having an abnormality in "rolling resistance", first, it is necessary to move the load drum 4 alternately in the front and rear direction (in a direction of approaching and leaving the tire and a direction indicated by an arrow in FIG. 2) by the drum moving unit. The load drum 4 moves in the front and rear direction. Specifically, the load drum 4 is moved rearward in an opposite pushing direction from a state where the load drum 4 is pushed to the tire such that the applied load measured by the load measurement sensor 2 is the predetermined load, so as to reduce the applied load, and the load drum 4 is turned forward in the pushing direction before the load drum 4 is separated from the tire. The load drum 4 is advanced until the applied load measured by the load measurement sensor 2 becomes the predetermined load, and then, the load drum 4 is turned again and is retreated in the opposite pushing direction. The load drum 4 is repeatedly moved forward and rearward in this manner, and the load drum 4 is moved alternately in the front and rear direction.

An advanced position and a retreated position of the load drum 4 are preferably stored in the tire sorting unit 9 in advance, similarly with a pushing position in the predetermined load obtained at the time of the above-described tire uniformity test. For example, when the position of the load drum 4 of a case where the load drum 4 is advanced most and the position of the load drum 4 of a case where the load drum 4 is retreated most are stored in advance, it is possible to perform a control to move the load drum 4 between those two positions.

In this embodiment, a timing to exchange the advance and the retreat of the load drum 4 is set to a frequency of 2 to 5 Hz. However, the frequency for exchanging the advance and the retreat is changed according to the type of the tire, the rolling resistance coefficient and the like. Therefore, the driving condition which accords with the test tire (has a high correlation with the test tire) is preferably obtained through an advance preliminary experiment. The repetition of the advance and the retreat of the above-described load drum 4 is performed over about one to two seconds. The applied load measured by the applied load measurement sensor 2 and the position of the load drum 4 measured by the displacement sensor 3 are output to the tire sorting unit 9.

The above-described load drum 4 may be moved in the front and rear direction before the tire uniformity test in a forward rotation direction and a rearward rotation direction is performed on the test tire, but is preferably moved after the tire uniformity test. The characteristic of the tire rubber is stabilized after the tire uniformity test in the forward rotation direction and the rearward rotation direction is performed, and thus it is possible to perform the test on all the tires under the same condition and to improve the accuracy of sorting out the tire.

Specifically, the load drum 4 is moved alternately in the front and rear direction so as to vary the applied load acting the tire large and small. The variation of the position of the load drum 4 is measured by the above-described displacement sensor 3, and the variation of the applied load is measured by the load measurement sensor 2. When the sequential variation of the position of the load drum 4 measured in this manner is plotted as "drum displacement", and the variation of the applied load is plotted on the same graph as "applied load", a change curve is obtained as illustrated in FIG. 3.

Figure 3:
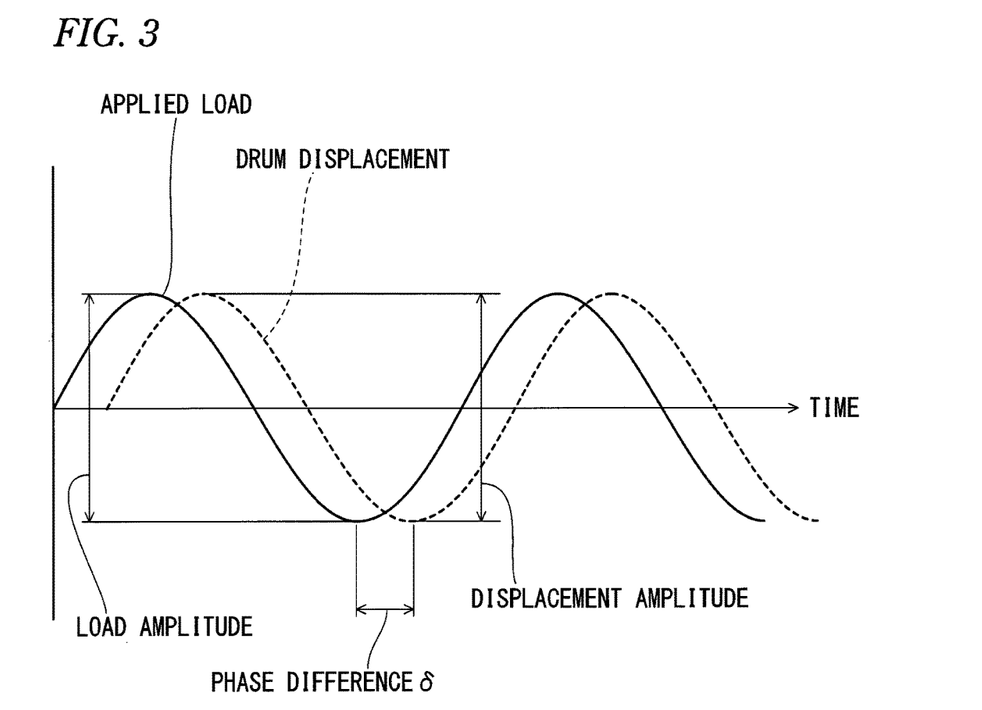
FIG. 3 is a graph schematically illustrating a phase difference between the displacement of a load drum and a load amplitude.

As illustrated in FIG. 3, the change curve of the "applied load" is recorded with being moved due to the attenuation characteristic of the tire rubber by the phase difference δ from the change curve of the "drum displacement" in a direction of pushing the tire. In the above-described tire sorting unit 9, the horizontal phase difference δ between the change curve of "drum displacement" and the change curve of "applied load" is calculated. The "tan δ" is calculated based on the phase difference δ calculated in this manner. The tire having an abnormality in rolling resistance is sorted out depending on whether the calculated "tan δ" exceeds the predetermined threshold value. Specifically, initially, the phase difference δ is measured with respect to a standard tire having no abnormality in property and characteristic. Next, the phase difference δ of the test tire is measured. In a case where there is a value beyond an allowable range compared to the value of the phase difference δ of the standard tire, in other words, a case where the phase difference δ exceeds the predetermined threshold value, it can be determined that the rolling resistance of the tire is larger than the standard value. For this reason, in a case where the phase difference δ exceeds the predetermined threshold value, the tire sorting unit 9 determines that the tested tire is the tire having an abnormality in rolling resistance, and the corresponding tire is excluded as necessary.

In a case where the calculated "tan δ" is equal to or less than the predetermined threshold value (in other words, the calculated tan δ is in the predetermined range compared to tan δ of the standard tire), the tested tire is determined as a tire having normal rolling resistance, and is treated as a tire satisfying product standard. When the above-described rolling resistance prediction device 1 and tire sorting method are used, "tan δ" which is highly correlated with the rolling resistance of the tire can be obtained, and the abnormality of the rolling resistance of the tire can be simply determined based on the obtained "tan δ". As a result, the tire having an abnormality in rolling resistance can be accurately sorted out in a short time so that the total inspection of the rolling resistance can be performed on a plurality of manufactured product tires similarly with the tire uniformity. By the tire uniformity testing machine, it is possible to determine the abnormality in the rolling resistance, and it is possible to reliably exclude the defect tire.

The tire sorting method of the present invention can be implemented by the above-described method. However, in order to obtain "tan δ" more accurately, the tire sorting method is desirably performed in accordance with following operations described in (1) to (4).

(1) "The above-described phase difference δ is calculated from an applied load obtained by removing the inertial force of the load drum 4 from the applied load measured in the load measurement sensor 2 and the variation of the position of the load drum 4."

In a case where the load drum 4 having substantial weight and large inertia moment is moved, the large inertial force is generated in the load drum 4. In a case where the load measurement sensor 2 is provided in the rotating shaft 7 of the load drum 4 as described above, the inertial force generated in the load drum 4 is included also in a measurement value of the applied load measured by the load measurement sensor 2. For example, the inertial force is measured as a value obtained by adding the counterforce of the tire itself by the load measurement sensor 2. The inertial force acts in an opposite direction in the same phase as the variation of the position of the load drum 4 in proportion to the acceleration of the load drum 4. For this reason, the inertial force acts so as to reduce the phase difference δ calculated from the measurement value and worsens the accuracy of the phase difference δ necessary to sort out the tire.

In the tire sorting method of this embodiment, the inertial force of the load drum 4 is obtained from the product of the acceleration of the load drum 4 in the front and rear direction and the weight of the load drum 4. The acceleration of the load drum 4 in the front and rear direction can be obtained by second-order differentiating the position of the load drum 4 measured by the displacement sensor 3 with respect to time. After the inertial force of the load drum 4 is calculated, the calculated inertial force of the load drum 4 is subtracted from the applied load measured by the load measurement sensor 2 so as to calculate the applied load (accurate applied load) from which the influence of the inertial force is excluded.

When the variation of the calculated applied load and the variation of the position of the load drum 4 are used, it is possible to calculate the above-described phase difference δ more accurately, and further to calculate tan δ more accurately.

In the case of a measurement using the above-described standard tire, a determination is performed through the relative comparison with the standard tire. For this reason, also in the test tire, the inertial force does not affect an evaluation result of the tire as long as the measurement is performed in the same condition as that of the standard tire.

(2) "The above-described phase difference δ is calculated in such a manner that the load drum 4 is moved alternately in the front and rear direction in a state where air is sealed in the tire to be measured"

That is, in the tire uniformity test in which a test is performed in a state where air is input inside the tire, it is general to adapt a pressure controller which maintains the inside air pressure of the tire constant. The pressure controller is configured to rapidly supply air into the tire or to discharge air from the inside of the tire such that the inside air pressure of the tire is maintained constant when a road surface and the like are pushed to sharply change the inside air pressure or volume of the tire.

For this reason, when the load drum 4 is moved in the front and rear direction to vary the applied load measured by the load measurement sensor 2, air flows from and to the inside of the tire by a deformation amount of the tire according to the displacement of the load drum 4, so as to maintain the inside air pressure of the tire constant. Such a flow of air by the pressure controller affects the counterforce of the tire and causes an energy loss to change the phase of the measurement load. That is, an adjustment of the air pressure by the pressure controller acts on the measurement accuracy of tan δ to be reduced.

In the tire sorting method of this embodiment, when the load drum 4 is moved alternately in the front and rear direction, the air is sealed in the tire in a sealed state where the above-described pressure controller does not perform a pressure control. Specifically, when the load drum 4 is moved in the front and rear direction, a switching valve which can block the flow of air through an air pipe between a pressure control valve forming the above-described pressure controller and the tire is provided in advance.

In this manner, when the load drum 4 is moved alternately in the front and rear direction, the switching valve can be switched to a side of controlling the flow of air, and after the measurement of the phase difference δ is ended, the switching valve can be switched to a side of allowing air to flow. As a result, it can be suppressed that the pressure controller adversely affects the load measurement accuracy of the applied load measurement sensor 2. When the measurement is performed in the state of sealing air in the tire, air does not flow so that attenuation according to the compression and expansion of air is reduced, and thus it is possible to calculate only the energy loss (tan δ) resulting from almost pure deformation of tire.

In the case of a measurement using the above-described standard tire, a determination is performed through the relative comparison with the standard tire. For this reason, also in the test tire, the compression and expansion of air do not affect an evaluation result of the tire as long as the measurement is performed in the same condition as that of the standard tire.

(3) "The load drum 4 is advanced and retreated (tan δ is measured) in a state where the tire and the load drum 4 are rotated."

That is, in a case where the load drum 4 is pushed to the tire not rotating, the load drum 4 is in contact with only one position of the tire, so that only a portion of the tire tread is deformed over a plurality of times. When such a deformation of only one position of the tire rubber is generated continuously, a flat spot (partial change of tire shape) is generated in the tire rubber, so that the accurate attenuation characteristic of the tire rubber is not obtained.

For this reason, in the rolling resistance prediction device 1 of this embodiment, the load drum 4 is advanced and retreated in a state where the tire and the load drum 4 are rotated. In this manner, it is prevented that only one position of the tire tread is continuously deformed, and thus it is possible to accurately evaluate the attenuation characteristic of the tire rubber. In this manner, the accurate attenuation characteristic of the tire rubber can be obtained, and also an average tan δ of the entire circumference of the tire can be calculated.

(4) "A tire having the known rolling resistance is set as a standard tire, and tan δ of the standard tire is obtained under each of the plurality of temperature conditions. A temperature correction function with respect to the phase difference δ (tan δ) is made based on the obtained tan δ, and the made temperature correction function is used to sort out a tire having an abnormality in rolling resistance."

In the test of the tire uniformity, the temperature of the measurement circumstance is not managed much, so that the temperature at the time of measuring is largely changed according to seasons and time. A type of correcting a rolling resistance coefficient based on a relative temperature difference from the standard temperature is defined in JIS D 4234. However, it is necessary that the measurement of each kind of the tires is performed in advance under a plurality of temperature conditions, and tan δ is corrected through the relative comparison with the result.

Specifically, in advance, it is understood what effect the temperature of the measurement circumstance has on the measurement result of the phase difference in the standard tire of which the property and the performance are in the standard, and a correction formula (temperature correction function) for correcting the value of tan δ is made. For example, by changing the temperature of the measurement circumstance of the rolling resistance prediction device 1, the value of tan δ of the standard tire in a wide temperature range is measured in advance. Such a preparatory measurement of tan δ is preferably performed also under a condition in which season, date, time, and the like are changed.

In a case where it is difficult to collect data on an effect of temperature, "a correction formula of rolling resistance measurement" defined in JIS D 4234 as described in formula (1) is preferably used. In the correction formula of JIS, a case where the temperature of the measurement circumstance is 25 degrees as a standard measurement temperature is set as a standard, and the value of the rolling resistance is corrected using a following formula. In addition, the correction formula of JIS is related to the rolling resistance, and assumed that the rolling resistance and tan δ have a proportional relation, the formula is valid even when a rolling resistance F in the formula is substituted to tan δ. Therefore, in consideration of this point, the correction may be performed using the correction formula in which the rolling resistance F in the formula is substituted to tan δ.

[Formula 1]

The measurement is performed at a temperature of 20° C. or more and 30° C. or less. In a case where the measurement is performed at a temperature except 25° C., a temperature correction is performed according to formula (1).

Herein, $F_{r25}$ indicates a rolling resistance (N) at 25° C.

$$F_{r25}=F_r \times [1+K_t \times (t_{amb}-25)] \quad (1)$$

Herein, $F_r$: rolling resistance (N)
$t_{amb}$: atmospheric temperature (° C.)
$K_t$: temperature correction coefficient:
in the tire for passenger car, 0.008 (/° C.)
in truck and bus tires (L1≤121), 0.010 (/° C.)
in truck and bus tires (L1≥122), 0.006 (/° C.)
L1: load capacity index In the above-described example of FIG. 3, when the load drum 4 is moved in the front and rear direction, the position of the load drum 4 is moved along a sine wave so that the generation of the acceleration at the time of inverting the moving direction is reduced. However, the position of the load drum 4 may be moved along triangular wave so that the load drum 4 is always and repeatedly advanced and retreated at a constant speed.

The above-described calculation of "tan δ" can be implemented also by a frequency analysis using Fourier transformation. For example, it is possible to calculate a transfer function of the load/displacement, and calculate δ from the value of the phase in the excitation frequency.

When the tire uniformity is measured by the tire uniformity testing machine, the measurement is performed with the inside pressure of the tire maintained about at 200 kPa. However, in order to improve the measurement accuracy of the above-described attenuation characteristic (tan δ) of the tire rubber, it is preferable that the measurement be performed in a state where the inside pressure of the tire is decreased to a lower degree than that at the time of the tire uniformity test, for example, from 200 kPa to 100 kPa. The reason why the measurement is performed with the inside pressure of the tire decreased as above is follows.

The attenuation of the tire associated with the rolling resistance is presented by the viscoelastic characteristic (viscoelasticity coefficient) of rubber. The attenuation is generally presented by formula (2) using a spring constant k indicating the elastic characteristic and tan δ indicating the viscosity characteristic.

[Formula 2]

$$K(1+\tan \delta \cdot j) \quad (2)$$

Herein, j is a complex number.

Figure 4:
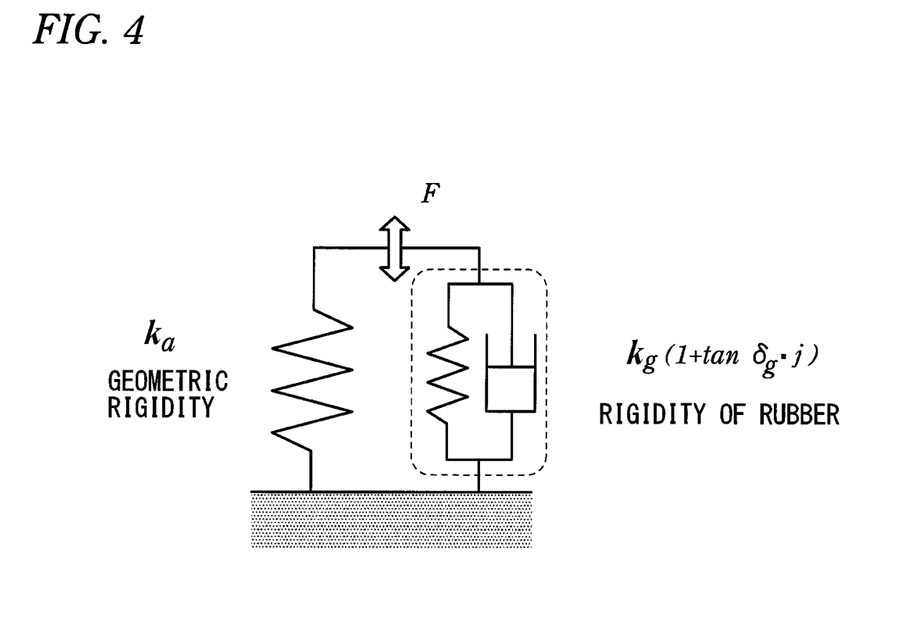
FIG. 4 is a diagram illustrating a viscoelastic characteristic of a tire using as a model.

Herein, the viscoelastic characteristic of the tire having air inside is considered. First, the tire cannot support the load only with rigidity of rubber, and the inside air pressure generates tension in the rubber so that the load is supported by the rigidity of the shape (geometric rigidity). In this case, as a model illustrated in FIG. 4, the viscoelastic characteristic of the tire includes the geometric rigidity of the inside air of the tire and the rigidity of the rubber forming the tire, and can be considered to be formed by coupling them in parallel. The geometric rigidity generated by air pressure can be presented using a spring constant ka. The viscoelastic characteristic of rubber forming the tire can be presented using a spring constant kg and a loss coefficient tan δg of the tire rubber.

In the geometric rigidity of air, there is no attenuation because of the rigidity of shape. The geometric rigidity of air is in proportion to the tension of rubber generated by the inside air pressure of the tire. Considering above description, the viscoelastic characteristic (viscoelasticity coefficient) of the entire tire can be presented as formula (3).

[Formula 3]

$$k_a + k_g(1+\tan\delta_g \cdot j) = (k_a+k_g)\left(1+\frac{k_g}{k_a+k_g}\tan\delta_g \cdot j\right) = k_t(1+\tan\delta_t \cdot j) \quad (3)$$

By formula (3), the loss coefficient (tan δt) of the entire tire can be described as formula (4).

[Formula 4]

$$\tan\delta_t = \left(\frac{k_g}{k_a + k_g}\right)\tan\delta_g \quad (4)$$

That is, as apparent from the above-described formula (4), when the inside air pressure of the tire becomes small, the spring constant ka of the geometric rigidity generated by the air pressure also becomes small, and the loss coefficient tan δt of the tire obtained by measuring becomes large. In other words, δt corresponds to the phase difference between the load and the displacement of a measurement target, and thus, when the inside air pressure of the tire becomes small, the value of δt (absolute value) also becomes large.

Therefore, when the inside air pressure of the tire becomes small, in other words, a tire inside pressure of 200 kPa generally used at the time of measuring the tire uniformity is reduced to a degree of 100 kPa, and the attenuation characteristic of the tire (loss coefficient tan δt of tire) is measured by advancing and retreating the load drum 4 while rotating the tire, it is possible to accurately measure the loss coefficient tan δg of the tire rubber.

Figure 5A:
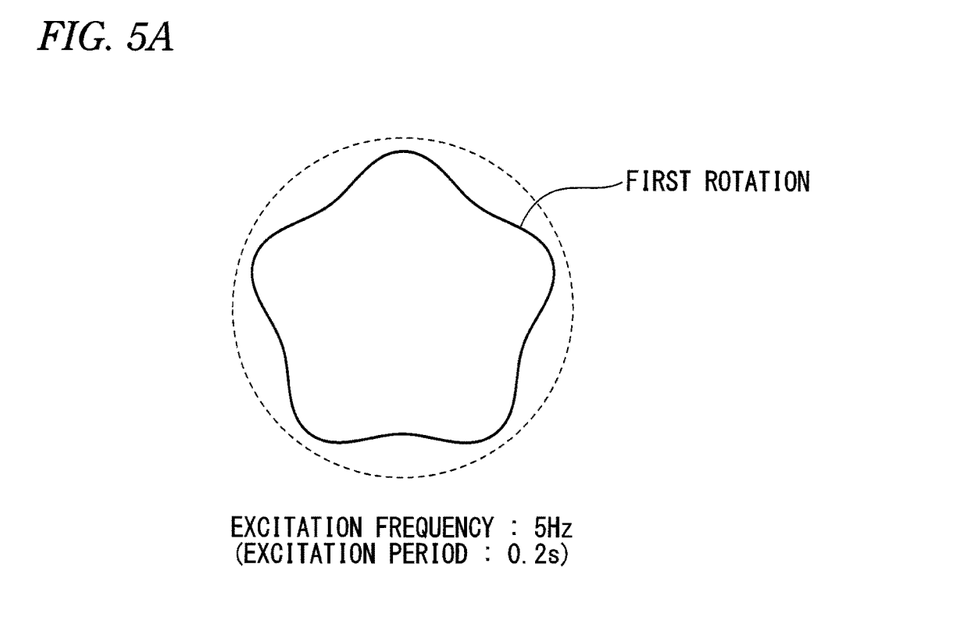
FIG. 5A is a diagram illustrating a transformation locus of a tire in a case where the rotational speed of the tire is set to 1 Hz, and the excitation frequency of the load drum is set to 5 Hz.

When the above-described load drum 4 is pushed to the tire in the front and rear direction in a range in which the load acts, a relation between a pushing period of the load drum 4 (excitation period of the load drum 4) and a rotation period of the tire is preferably defined in the predetermined relation. For example, when the excitation frequency in a case where the load drum 4 is moved to be pushed in the front and rear direction is set to an integer multiple of the rotation frequency of the tire, as illustrated in FIG. 5A, a deformation state of an irregularity of the tire formed due to a front and rear movement of the load drum 4 is fixed in a specific position in a circumferential direction of the tire.

The rubber characteristic of the tire is not necessarily uniform in the circumferential direction (reason why the tire uniformity measurement is performed), that is, for example, when the attenuation characteristic is measured two times with respect to the same tire, the phase at the time of pushing in the specific position of the load drum 4 with respect to the tire is different between first time and the second time. Thus, the attenuation characteristic (phase difference between displacement and load) of the tire is different between the first time and the second time even in the same tire, which is checked by the present inventor through an experiment. When the deformation of irregularity of the tire is fixed to the specific position as described, the transformation locus is not changed although the tire is rotated many times, and thus the accuracy is not improved although the measurement time is set long.

In a case where an excitation period of the load drum 4 in the front and rear direction is set to Td, and a rotation period of the tire is set to Tt, the measurement time of measuring the applied load is set to N×Tt (N is an integer equal to or more than 2). The excitation period Td of the load drum 4 in the front and rear direction is set such that Tt/Td is not an integer and N×Tt/Td is an integral value. Under the condition that the above relation is satisfied, the average attenuation in the circumferential direction of the tire associated with the rolling resistance can be measured.

Figure 5B:
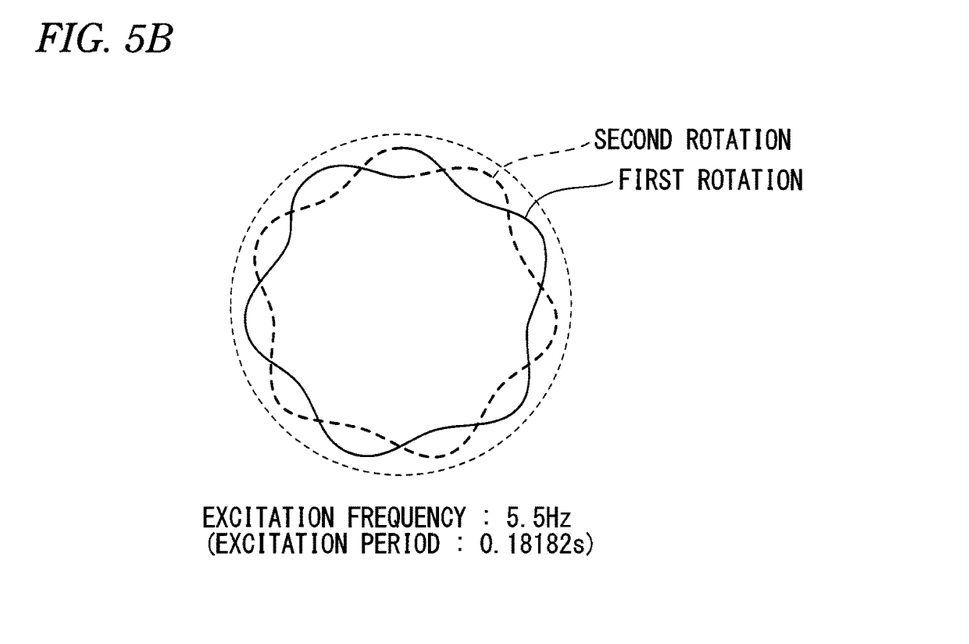
FIG. 5B is a diagram illustrating the transformation locus of the tire in a case where the rotational speed of the tire is set to 1 Hz, and the excitation frequency of the load drum is set to 5.5 Hz.
Figure 5C:
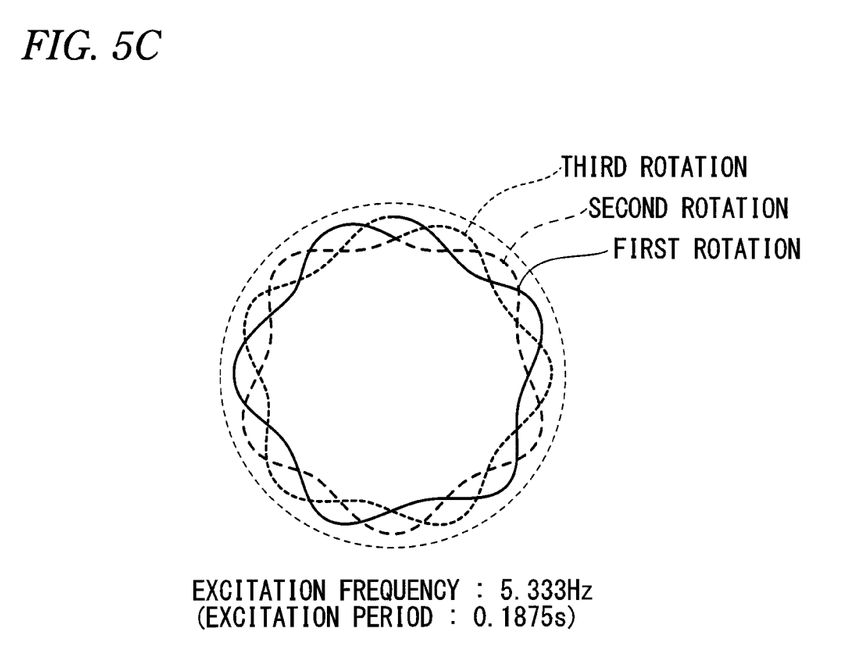
FIG. 5C is a diagram illustrating the transformation locus of the tire in a case where the rotational speed of the tire is set to 1 Hz, and the excitation frequency of the load drum is set to 5.333 Hz.
Figure 6:
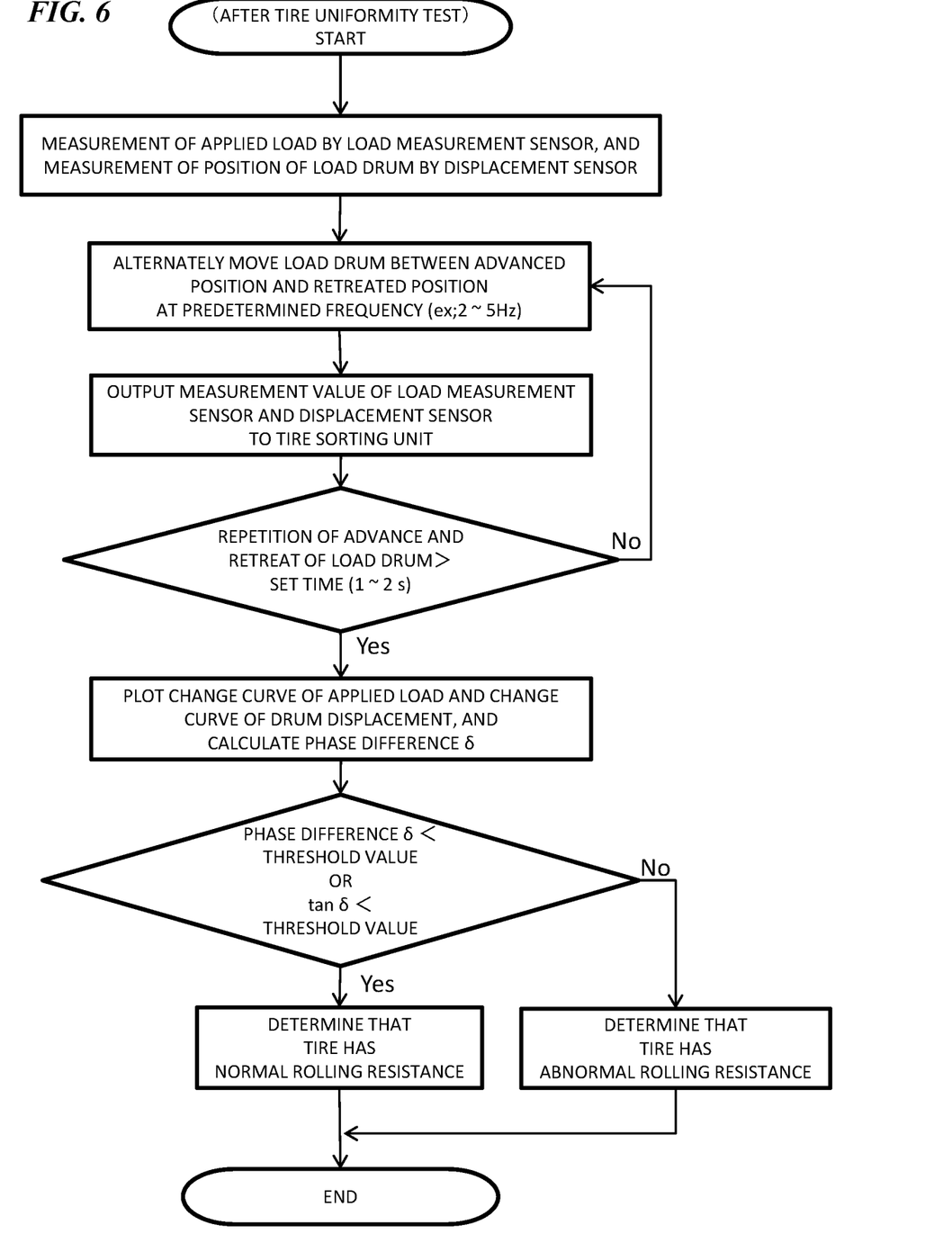
FIG. 6 is a flowchart illustrating a method for a method for predicting a rolling resistance of a tire using a tire rolling resistance prediction device according to FIGS. 1 and 2.

An "integral value" in "N×Tt/Td is an integral value" includes an "integer" in a mathematical meaning, and a decimal which is extremely close to an integer. For example, in the case of rounding off decimals of "2.04" and "1.98" to two decimal places, a value of which the decimal places become "0" is also included in the above-described "integral value". In a case where the above-described measurement condition: "in the excitation period Td of the load drum 4 in the front and rear direction, Tt/Td is not an integer" is satisfied, the phase of the position of being pushed by the load drum 4 is changed per rotation of the tire as illustrated in FIG. 5B or 5C. That is, the position of being pushed by the load drum 4 is different in the circumferential direction of the tire between first turn and second turn, and the irregularity of the tire surface caused by a push of the load drum 4 is not formed at the same position in the circumferential direction. Therefore, it is possible to improve the measurement accuracy of the attenuation characteristic.

In a case where the condition that "N times of Tt/Td is an integral value" is satisfied, when the tire rotates N times, the tire returns to an original state. For example, in the case of FIG. 5B, since N is two, the tire returns to an original pushing position when the tire rotates two times, and the load drum 4 pushes the same position of the outer circumference of the tire. In the case of FIG. 5C, since N is three, the tire returns to an original pushing position when the tire rotates three times, and the load drum 4 pushes the same position of the outer circumference of the tire.

In this manner, it is possible to push the load drum 4 at positions into which the entire circumference of the tire is finely and equally divided, and the positions of being pushed by the load drum 4 are disposed in the outer circumference of the tire equally without irregularity, whereby the measurement accuracy of the attenuation characteristic of the tire is largely improved.

The embodiment disclosed herein is a mere example from every aspect and should be understood as being not limitative. Particularly, what is not clearly disclosed in the disclosed embodiment, such as driving conditions, operation conditions, various parameters, dimensions of structures, the weight, and the volume does not deviate from the range within which a person skilled in the art usually use. The embodiment uses the values easily assumable by a person skilled in the art.

DESCRIPTION OF REFERENCE NUMERALS AND SIGNS

1 rolling resistance prediction device
2 load measurement sensor
3 displacement sensor
4 load drum
5 tire shaft
6 simulation road surface
7 rotating shaft
8 frame member
9 tire sorting unit

The invention claimed is:
1. A tire rolling resistance prediction method for sorting out a tire having an abnormality in rolling resistance by using a rolling resistance prediction device, the rolling resistance prediction device including: a load measurement sensor configured to measure an applied load applied to the tire when a load drum simulating a travel road surface is brought into compressive contact with a tread surface of the tire; and a displacement sensor configured to measure a position of the load drum in a load direction, the tire rolling resistance prediction method comprising:
varying the applied load acting on the tire by alternately moving the load drum in a direction of approaching and leaving the tire;

calculating a phase difference between a variation of the position of the load drum and a variation of the applied load, the phase difference being calculated by comparing the time variation of the position of the load drum and the time variation of the applied load; and sorting out the tire having an abnormality in rolling resistance based on the calculated phase difference.

2. The method according to claim 1, wherein a tire having the phase difference exceeding a predetermined threshold value is determined as the tire having an abnormality in rolling resistance.

3. The method according to claim 1, wherein when the phase difference is set to δ, a tire having tan δ exceeding a predetermined threshold value is determined as the tire having an abnormality in rolling resistance.

4. The method according to claim 1, wherein:

the phase difference between the variation of the position of the load drum and an applied load, in which inertial force of the load drum is removed, is calculated; and the inertial force of the load drum is calculated from a product of acceleration of the load drum in the approaching and leaving direction and weight of the load drum.

5. The method according to claim 1, wherein a tire uniformity testing machine configured to evaluate uniformity in a circumferential direction of the tire is used as the rolling resistance prediction device.

6. The method according to claim 1, wherein air is sealed in the tire when the load drum is alternately moved in the approaching and leaving direction.

7. The method according to claim 1, wherein the applied load acting on the tire is varied in a state where the load drum and the tire are rotated.

8. The method according to claim 7, wherein when the applied load applied to the tire is measured while varying the applied load acting on the tire, in a case where an excitation period of the load drum in the approaching and leaving direction is set to Td, and a rotation period of the tire is set to Tt, a measurement time for measuring the applied load is set to N×Tt, when N is an integer of 2 or more, and Td is set such that Tt/Td is not an integer, and N×Tt/Td is an integral value.

9. The method according to claim 1, wherein:

a tire having a well-known rolling resistance is set as a standard tire;

the position of the load drum with respect to the standard tire and the applied load are obtained under each of a plurality of temperature conditions;

the obtained positions of the load drum and the applied loads under the plurality of temperature conditions are used to make a temperature correction function with respect to the phase difference; and the made temperature correction function is used to sort out the tire having an abnormality in rolling resistance.

10. A tire rolling resistance prediction device comprising:

a tire sorting unit configured to perform the method according to claim 1.

11. A tire rolling resistance prediction device comprising:

a load measurement sensor configured to measure an applied load applied to a tire when a load drum simulating a travel road surface is brought into compressive contact with a tread surface of the tire;

a displacement sensor configured to measure a position of the load drum in a load direction;

a drum moving unit configured to vary the applied load acting on the tire by alternately moving the load drum in a direction of approaching and leaving the tire; and a tire sorting unit configured to calculate a phase difference between a variation of the position of the load drum and a variation of the applied load, the phase difference being calculated by comparing the time variation of the position of the load drum and the time variation of the applied load, and configured to sort out a tire having an abnormality in rolling resistance based on the calculated phase difference.

* * * * *